(12) United States Patent
Chang et al.

(10) Patent No.: US 9,223,634 B2
(45) Date of Patent: Dec. 29, 2015

(54) SYSTEM AND METHOD FOR SIMULATING VIRTUAL MACHINE MIGRATION IN A NETWORK ENVIRONMENT

(75) Inventors: David Wei-Shen Chang, Milpitas, CA (US); Abhijit Patra, Saratoga, CA (US); Nagaraj A. Bagepalli, Fremont, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 530 days.

(21) Appl. No.: 13/462,200

(22) Filed: May 2, 2012

(65) Prior Publication Data
US 2013/0297769 A1 Nov. 7, 2013

(51) Int. Cl.
*G06F 9/455* (2006.01)
*G06F 9/50* (2006.01)
*H04L 12/24* (2006.01)
*H04L 29/08* (2006.01)
(Continued)

(52) U.S. Cl.
CPC .............. *G06F 9/5077* (2013.01); *G06F 9/445* (2013.01); *G06F 9/45558* (2013.01); *G06F 17/50* (2013.01); *H04L 41/145* (2013.01); *H04L 67/34* (2013.01); *H04L 67/38* (2013.01); *G06F 2009/4557* (2013.01)

(58) Field of Classification Search
CPC ... H04L 47/2491; H04L 67/10; H04L 41/145; H04L 41/0803; G06F 9/45533; G06F 9/455; G06F 3/0619; G06F 3/065
USPC .................................................. 709/224, 226
See application file for complete search history.

(56) References Cited

U.S. PATENT DOCUMENTS 7,277,948 B2   10/2007   Igarashi et al.
8,234,377 B2    7/2012   Cohn
(Continued)

FOREIGN PATENT DOCUMENTS

EP   2228719   9/2010
EP   2439637   4/2012

OTHER PUBLICATIONS

Juniper Networks, Inc., "Recreating Real Application Traffic in Junosphere Lab," Solution Brief, Dec. 2011, 3 pages; http://www.mudynamics.com/wp-content/uploads/2011/12/junosphere_solution_brief.pdf.
(Continued)

*Primary Examiner* — Uzma Alam
(74) *Attorney, Agent, or Firm* — Patent Capital Group (57) ABSTRACT

A method includes simulating network resources of a portion of a cloud in a simulated cloud within a enterprise network, the cloud being communicable with the enterprise network over a first communication channel, which may be external to the enterprise network. The method can also include simulating network behavior of the first communication channel in a second communication channel within the enterprise network, and validating application performance in the simulated cloud. Simulating network resources includes providing a cloud resources abstraction layer in the enterprise network, and allocating enterprise network resources in the enterprise network to the simulated cloud by the cloud resources abstraction layer. The method further includes adding a virtual network service appliance to the simulated cloud, and determining a change to a network topology of the enterprise network to accommodate the virtual appliance without materially impacting application performance.

20 Claims, 7 Drawing Sheets

(51) Int. Cl.
  *G06F 9/445* (2006.01)
  *H04L 29/06* (2006.01)
  *G06F 17/50* (2006.01)

(56) References Cited

U.S. PATENT DOCUMENTS

| | | | |
|---|---|---|---|
| 8,532,108 B2 | 9/2013 | Li et al. | |
| 2009/0323706 A1 | 12/2009 | Germain et al. | |
| 2011/0075667 A1 | 3/2011 | Li et al. | |
| 2011/0173303 A1 | 7/2011 | Rider | |
| 2011/0231899 A1* | 9/2011 | Pulier et al. | 726/1 |
| 2011/0239039 A1* | 9/2011 | Dieffenbach et al. | 714/4.1 |
| 2011/0261828 A1 | 10/2011 | Smith | |
| 2011/0276675 A1 | 11/2011 | Singh et al. | |
| 2011/0276951 A1 | 11/2011 | Jain | |
| 2012/0054367 A1 | 3/2012 | Ramakrishnan et al. | |
| 2012/0072578 A1* | 3/2012 | Alam | 709/224 |
| 2012/0072985 A1 | 3/2012 | Davne et al. | |
| 2012/0084445 A1 | 4/2012 | Brock et al. | |
| 2012/0084782 A1 | 4/2012 | Chou et al. | |
| 2012/0096134 A1 | 4/2012 | Suit | |
| 2012/0131174 A1* | 5/2012 | Ferris et al. | 709/224 |
| 2012/0167094 A1* | 6/2012 | Suit | 718/100 |
| 2012/0179909 A1 | 7/2012 | Sagi et al. | |
| 2012/0265976 A1* | 10/2012 | Spiers et al. | 713/2 |
| 2012/0281706 A1 | 11/2012 | Agarwal et al. | |
| 2012/0311106 A1 | 12/2012 | Morgan | |
| 2012/0324114 A1* | 12/2012 | Dutta et al. | 709/226 |
| 2013/0036213 A1 | 2/2013 | Hasan et al. | |
| 2013/0111540 A1 | 5/2013 | Savin | |
| 2013/0138816 A1* | 5/2013 | Kuo et al. | 709/226 |
| 2013/0152175 A1 | 6/2013 | Hromoko et al. | |
| 2013/0182712 A1 | 7/2013 | Aguayo et al. | |
| 2013/0185433 A1* | 7/2013 | Zhu et al. | 709/226 |
| 2013/0191106 A1* | 7/2013 | Kephart et al. | 703/21 |
| 2013/0268588 A1 | 10/2013 | Chang et al. | |
| 2013/0268643 A1 | 10/2013 | Chang | |
| 2013/0268799 A1 | 10/2013 | Mestery et al. | |
| 2013/0283364 A1 | 10/2013 | Chang et al. | |
| 2013/0297769 A1 | 11/2013 | Chang et al. | |
| 2014/0040473 A1* | 2/2014 | Ho et al. | 709/226 |
| 2014/0040883 A1* | 2/2014 | Tompkins | 718/1 |
| 2014/0156557 A1* | 6/2014 | Zeng et al. | 705/348 |

OTHER PUBLICATIONS

Shunra, "Shunra for HP Software™: Enabling Confidence in Application Performance Before Deployment," 2010, 2 pages; http://www.shunra.com/sites/default/files/Shunra_for_HP_datasheet_16-11.pdf.

Ali G. Saidi, et al., "Performance Validation of Network-Intensive Workloads on a Full-System Simulator," Interaction between Operating System and Computer Architecture Workshop, (IOSCA 2005), Austin, Texas, Oct. 2005, 10 pages; http://www.eecs.umich.edu/techreports/cse/2005/CSE-TR-511-05.pdf.

U.S. Appl. No. 14/058,041, filed Oct. 18, 2013, entitled "Method and System of Providing Storage Services in Multiple Public Clouds," Inventors: David Wei-Shen Chang et al.

Borovick, Lucinda, et al., "Architecting the Network for the Cloud," IDC White Paper, Jan. 2011, 8 pages.

"Joint Cisco and VMWare Solution for Optimizing Virtual Desktop Delivery: Data Center 3.0: Solutions to Accelerate Data Center Virtualization," Cisco Systems, Inc. and VMware, Inc., Sep. 2008; 10 pages.

"Best Practices in Deploying Cisco Nexus 1000V Series Switches on Cisco UCS B and C Series Cisco UCS Manager Servers," Cisco White Paper, Cisco Systems, Inc., Apr. 2011; 36 pages. http://www.cisco.com/en/US/prod/collateral/switches/ps9441/ps9902/white_paper_c11-558242.pdf; 36 pages.

"Cisco Unified Network Services: Overcome Obstacles to Cloud-Ready Deployments," Cisco White Paper, Cisco Systems, Inc., Jan. 2011; 6 pages.

\* cited by examiner

SYSTEM AND METHOD FOR SIMULATING VIRTUAL MACHINE MIGRATION IN A NETWORK ENVIRONMENT

TECHNICAL FIELD

This disclosure relates in general to the field of communications and, more particularly, to a system and a method for simulating virtual machine migration in a network environment.

BACKGROUND

A trend towards virtualization in the information technology (IT) arena is driving the development of many virtualization technologies such as network virtualization. Network virtualization solutions can consolidate multiple physical networks into one virtual network. They can also logically segment a single physical network into multiple logical networks. Partitions can be added to rapidly scale the network for business needs. Network virtualization represents a new IT paradigm, challenging existing physical network deployment models. Network virtualization offers many benefits such as expanding availability of single IT assets to multiple users, managing multiple IT assets as a single resource, and providing dedicated virtual networks for applications: all of which can lead to revenue generation, expense reduction, and customer satisfaction.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Overview

An example method includes simulating network resources of a portion of a cloud in a simulated cloud within an enterprise network. The broad term "simulating" can include imitating, reproducing, mimicking, copying, impersonating, emulating, duplicating, or any other type of performance of certain cloud activities in such a context. The cloud can communicate with the enterprise network over a first communication channel, which may be external to the enterprise network. The method further includes simulating network behavior of the first communication channel in a second communication channel within the enterprise network, and validating application performance in the simulated cloud. The term 'validating' in such a context can include any type of affirmation, checking, verifying, ensuring a certain quality level or threshold has been met, confirming, ratifying, endorsing, assessing, inspecting, examining, etc.

In particular embodiments, the first communication channel may have a first wide area network (WAN) latency and a first error rate. The simulating network behavior can include adding a second WAN latency and injecting a second error rate in the second communication channel, where the second WAN latency and the second error rate substantially replicate the first WAN latency and the first error rate, respectively. In particular embodiments, the first communication channel can connect a first cloud gateway within the enterprise network to a second cloud gateway within the cloud, and the second communication channel can connect a third cloud gateway within the enterprise network to a fourth cloud gateway within the simulated cloud. The third cloud gateway may be materially similar to the first cloud gateway, and the fourth cloud gateway may be materially similar to the second cloud gateway. In specific embodiments, the first communication channel is provided (e.g., linked, provisioned, extended, coupled, etc.) over a public network, and the second communication channel is provided over a simulated public network within the enterprise network. The simulated public network may be materially similar to the public network.

In some embodiments, simulating the network resource can include providing a cloud resources abstraction layer in the enterprise network, and by the cloud resources abstraction layer, allocating enterprise network resources in the enterprise network to the simulated cloud. The method may further include deploying a virtual machine in the simulated cloud over network connections within the enterprise network. In other embodiments, the method may further include adding a virtual network service appliance to the simulated cloud, and determining a change to a network topology of the enterprise network to accommodate the virtual network service appliance without materially adversely impacting application performance. In yet other embodiments, the method may further include adding a security policy at the simulated cloud and validating the security policy, where the validating comprises isolating a security policy inconsistency and isolating a particular network enforcement activity by the simulated cloud.

Example Embodiments

Figure 1:
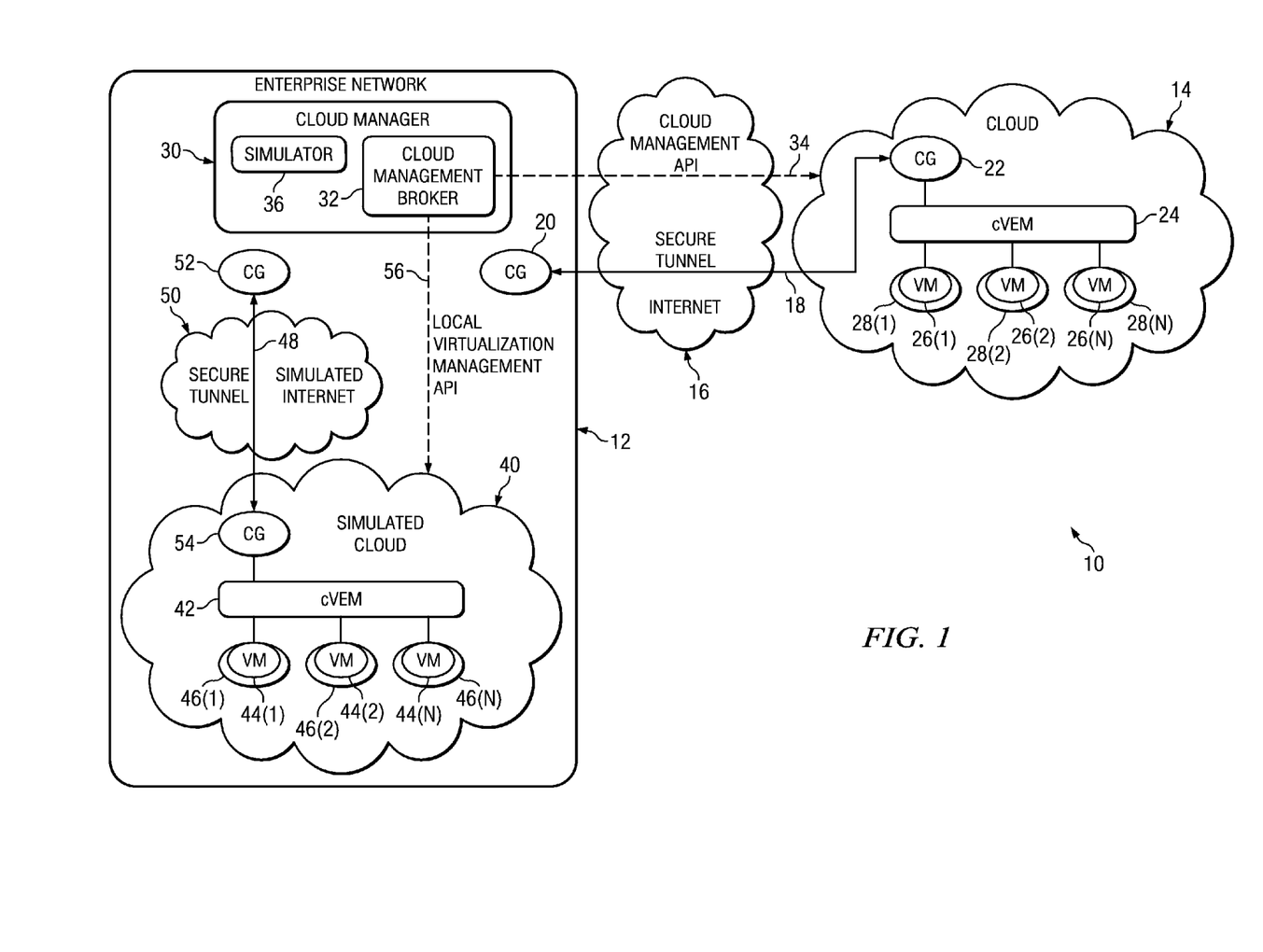
FIG. 1 is a simplified block diagram illustrating a communication system for simulating virtual machine migration in a network environment.

Turning to FIG. 1, FIG. 1 is a simplified block diagram illustrating a communication system 10 for simulating virtual machine migration in a network environment in accordance with one example embodiment. FIG. 1 illustrates an enterprise network 12 in communication with a cloud 14 over a public network, such as Internet 16, via a secure tunnel 18. As used herein, the term "public network" encompasses networks, where devices on the network are visible and accessible to outsiders (e.g., other devices, users) outside the network. Secure tunnel 18 may connect a cloud gateway 20 in enterprise network 12 with a corresponding cloud gateway 22 in cloud 14.

Network resources of enterprise network 12 may be extended into cloud 14 through a cloud Virtual Ethernet Module (cVEM) 24. As used herein, the term "network resource" may encompass network elements, links (e.g., transmission connections between nodes in a network), and data, including computing resources (e.g., processors), and storage resources (e.g., storage devices, databases). The term "network element" is meant to encompass computers, network appliances, servers, storage devices, computation devices, routers, switches, gateways, bridges, load balancers, firewalls, processors, modules, or any other suitable device, component, element, or object operable to exchange information in a network environment. Moreover, the network elements may include any suitable hardware, software, components, modules, interfaces, or objects that facilitate the operations thereof. This may be inclusive of appropriate algorithms and communication protocols that allow for the effective exchange of data or information.

cVEM 42 may be embedded in (or communicable with) cloud gateway 22 and may enable switching inter-virtual machine traffic at cloud 14. cVEM 24 may be configured to perform Layer 2 switching and advanced networking functions such as port-channels, quality of service (QoS), security (e.g., private virtual local area network (VLAN), port security, etc.), and monitoring (e.g., net-flow, switch port analyzer (SPAN), encapsulated remote SPAN, etc.). A plurality of virtual machines (VMs) 26(1)-26(N) may be provisioned in cloud 14. In some embodiments, nested VM containers (NVCs) 28(1)-28(P) may be provisioned in cloud 14 to host respective VMs 26(1)-26(N). In various embodiments, NVCs 28(1)-28(N) may provide a network overlay, for example, to facilitate computing, storage, and networking services for running application workloads and connecting respective VMs 26(1)-26(N) with enterprise network 12.

According to embodiments of the present disclosure, enterprise network 12, and cloud 14 may form a hybrid cloud network environment. Enterprise network 12 may be any private network such as a data center network, operated and controlled by a particular entity or organization. Cloud 14 is a collection of hardware and software ("cloud infrastructure") forming a shared pool of configurable network resources (e.g., networks, servers, storage, applications, services, etc.) that can be suitably provisioned to provide on-demand self-service, network access, resource pooling, elasticity and measured service, among other features. In various embodiments, cloud 14 may be deployed as a private cloud (e.g., infrastructure operated by a single enterprise/organization), community cloud (e.g., infrastructure shared by several organizations to support a specific community that has shared concerns), public cloud (e.g., infrastructure made available to the general public), or a suitable combination of two or more disparate types of clouds.

Cloud 14 may be managed by a cloud service provider, who can provide enterprise network 12 with access to cloud 14 and authorization to set up secure tunnel 18 in accordance with a predetermined service level agreement (SLA). In particular, network resources within cloud 14 are not controlled by the particular entity or organization controlling enterprise network 12; rather, the network resources are allocated to enterprise network 12 according to the SLA with the cloud service provider. For example, enterprise network 12 may be signed up for using a fixed amount of Central Processing Unit (CPU) processors, storage, and network services.

In various embodiments, a cloud manager 30 in enterprise network 12 may provide a management platform (e.g., through a VM). For example, cloud manager 30 may facilitate hybrid cloud operations in cloud 14, manage network resources in cloud 14 that are allocated to enterprise network 12, dynamically instantiate cloud gateways 20 and 22, and perform various other management functions through an enterprise virtualization platform and cloud provider application programming interfaces (APIs). Cloud manager 30 may also monitor the health of substantially all components in enterprise network 12 (and allocated network resources in cloud 14), and provide high availability of those components based on particular needs.

In various embodiments, cloud manager 30 may use a Cloud Management Broker (CMB) 32 to provide an interface to a management entity of cloud 14. When enterprise customers request migrating workload (e.g., VM) to cloud 14, CMB 32 may translate high-level resource requirements into a set of cloud management application programming interfaces (APIs) 34. CMB 32 may submit cloud management APIs 34 to the management entity of cloud 14 for requesting desired network resources. For example, CMB 32 could submit a request for a VM to run cloud gateway 22 at cloud 14 through suitably configured cloud management API 34.

In various embodiments, cloud manager 30 may include a simulator 36 that can simulate network resources of a portion of cloud 14 in a simulated cloud 40 within enterprise network 12. Simulator 36 may interface with CMB 32 to support the management function of a local virtualization platform within enterprise network 12 (e.g. VMware® vCenter). CMB 32 can fulfill hybrid cloud resource requirements from simulator 36 by allocating network resources from a local resource pool within enterprise network 12. CMB 32 could provide a cloud resources abstraction layer, which helps to simulate resource provisioning of cloud 14 in simulated cloud 40 within enterprise network 12. For example, CMB 32 may submit a local virtualization management API 56 for provisioning network resources within simulated cloud 40.

In some embodiments, simulating network resources can include replicating material characteristics or functionalities of particular network resources of cloud 14 in simulated cloud 40. In other embodiments, simulating network resources can include reproducing, substantially identically, particular network resources of cloud 14 in simulated cloud 40. In yet other embodiments, simulating network resources can include substantially approximating network behavior of particular network resources of cloud 14 in simulated cloud 40 so that the simulated network resources of simulated cloud 40 are materially similar to the particular network resources of cloud 14.

It may be noted that simulated cloud 40 is not merely an abstract mathematical construct, for example, existing as virtual artifacts in a software application. In addition, simulated cloud 40 includes actual network elements selected from a local network resource pool of enterprise network 12 to replicate, substantially, and/or materially, a planned or available network resource pool of cloud 14. Simulated cloud 40 may include various simulated network resources. For example, simulated cloud 40 may include a virtual cVEM 42 connecting virtual machines 44(1)-44(N), which may be substantially or materially similar to virtual machines 26(1)-26(N), respectively, in cloud 14.

Material similarity may exist (even where substantial similarity is absent) if functionalities, application performance, network behavior, and other measurable parameters of interest of the simulated network element in simulated cloud 40 matches with the corresponding network element in cloud 14. For example, VM 26(1) in cloud 14 may be provisioned on a blade server running a Linux operating system whereas VM 44(1) in enterprise network 12 may be provisioned on a rack server running a Windows operating system. Despite the difference in infrastructure, VM 44(1) and VM 26(1) may have similar functionalities and operating performance, sufficiently materially similar, for purposes of the present disclosure. Likewise, cVEM 42 may be substantially or materially similar to cVEM 24 in cloud 14. NVCs 46(1)-46(N) in simulated cloud 40 may be substantially or materially similar to respective NVCs 28(1)-28(P) in cloud 14. A secure tunnel 48 over a simulated Internet 50 may connect a cloud gateway 52 with another cloud gateway 54 within simulated cloud 40. Cloud gateway 52 may be substantially or materially similar to cloud gateway 20; likewise, cloud gateway 54 may be substantially or materially similar to cloud gateway 22 in cloud 14.

In various embodiments, network behavior of secure tunnel 18 may be simulated in secure tunnel 48 within enterprise network 12. As used herein, "network behavior" can include (but is not limited to) network conditions such as packet loss, latency, and available bandwidth; network performance; network traffic; network activity; protocols used; and other such behavior or characteristics of the network connection. In some embodiments, simulating network behavior includes replicating network latency, error rates, and other network characteristics. In yet other embodiments, simulating network behavior can include substantially approximating network latency, error rates and other network characteristics so that secure tunnel 48 behaves in a materially similar manner to secure tunnel 18. Likewise, simulated Internet 50 may simulate network behavior of Internet 16 within enterprise network 12. In various embodiments, using simulated cloud 40, and secure tunnel 48, data transfer from within enterprise network 12 to network resources (e.g., VM 44(1)-44(P)) of simulated cloud 40 may be validated. "Data," as used herein in this specification, refers to any type of numeric, text, voice, video, or script information, or any type of source or object code, or any other suitable information in any appropriate format that may be communicated from one point to another in electronic devices and/or networks. Data may include applications, files, folders, and hyperlinks, among other examples.

For purposes of illustrating the techniques of communication system 10, it is important to understand the communications in a given system such as the system shown in FIG. 1. The following foundational information may be viewed as a basis from which the present disclosure may be properly explained. Such information is offered earnestly for purposes of explanation only and, accordingly, should not be construed in any way to limit the broad scope of the present disclosure and its potential applications.

Until recently, data center networks were designed under the assumption that each end node was connected to an access port of a switch in the network and the end node corresponded to one server running a single instance of an operating system (OS) and a single instance of a given application. Another assumption was that the application and its associated OS would be persistently bound to that specific physical server and would rarely, if ever, move onto another physical server. In recent years, introduction of server virtualization has invalidated these assumptions and posed some new challenges for data center network designs.

Server virtualization modifies both of the previously mentioned assumptions of data center network design by allowing multiple operating systems to transparently share the same physical server and input/output (I/O) devices. Local switching is used between different VMs within the same server, invalidating the assumption that each network access port corresponds to a single physical server running a single instance of an OS. Moreover, by abstracting hardware from software, virtualization effectively enables VMs to become mobile, which means that a VM can be moved from one physical server to another within the data center or even across multiple data centers or networks, including from within an enterprise network to a cloud extension (e.g., as part of cloud 14).

The consequences of such level of mobility on the network are not trivial. Mobility of VMs can pose stringent requirements on the underlying network infrastructure. For example, it could require that both the source and destination hosts be part of the same set of Layer 2 domains (e.g., VLANs). Features such as port security, IEEE 802.1x, and Internet Protocol (IP) source guard that maintain state information based on the physical port may not be deployed in virtualized networks, as the VM may move at any instant. Further, as VMs move from one physical server to another, it may be desirable that all the network policies defined in the network for the VM (for example, ACLs) be consistently applied, without regard to the location of the VM in the network.

VEMs, which include virtual interfaces that maintain network configuration attributes, security, and statistics across mobility events, may be dynamically provisioned within virtualized networks based on network policies stored in the DVS as a result of VM provisioning operations by a hypervisor management layer (e.g., vCenter). VEMs could be the virtual equivalent of physical network access ports. VEMs may follow virtual network interface cards (vNICs) when VMs move from one physical server to another. The movement can be performed while maintaining port configuration and state, including NetFlow, port statistics, and any Switched Port Analyzer (SPAN) session. By virtualizing the network access port with VEMs, transparent mobility of VMs across different physical servers and different physical access-layer switches within an enterprise network may be possible. However, when VMs are moved away from the enterprise network into a cloud extension, operated by an entity different from the entity that operates the enterprise network, certain issues could arise.

Enterprises may subscribe to IT capacity and applications in a cloud to extend the enterprise network based on demand and workload. In the cloud, software applications can be delivered transparently to the user (e.g., the user is effectively unaware of where the processing takes place). Additionally, virtual environments and compute capacity can be delivered as a service when business units require them, without the added cost of purchasing new hardware. Moreover, excess capacity can be easily returned to the pool of network resources once it is no longer needed. For example, enterprises may use hybrid cloud to extend their network resources.

Hybrid cloud is a cloud infrastructure composed of two or more clouds that interoperate or federate through technology. Hybrid cloud is an interaction between private and public clouds where private cloud joins public cloud and utilizes public cloud resources in a secure and scalable way. Hybrid cloud model provides the following key advantages over others cloud models: enterprises can protect their existing investment; enterprises can maintain control over their sensitive data and applications; enterprises can maintain full control over their network resources; enterprises can scale their environment on demand. However, some of the challenges in moving to a hybrid cloud environment involve network latency, network topology, and security policy.

Moving applications to a cloud-base deployment could require quantifying the implications of adding additional network hops from the corporate datacenters to cloud providers. Many enterprise applications are not designed with considerations of wide area network (WAN) link latency. Moreover, L2 network extension may need some adjustment of the L2 extension network topology, for example, by adding a router at the cloud for routing traffic efficiently in cloud networks. Other topological changes may also be necessary; however, predicting the topological changes apriori may be difficult, if not impossible. Further, security risks may be involved in running application workloads in the cloud.

Deploying a hybrid cloud, and migrating applications to the public part of the cloud are not trivial tasks. Corporate IT administrators should understand their application systems well to select an appropriate set of VMs for migration to the public cloud. In a multi-tiered application architecture, there are many factors involved to enable a distributed application in the cloud environment. Currently, many enterprises resort to a trial-by error approach to solve this problem. However, trial-by-error approach may not work well in a hybrid cloud environment because of the long lead-time involved in deploying network resources at the cloud. For example, the average time to move a VM image 10 Gigabytes in size could be more than 2 hours. Corporate IT administrators cannot afford the lengthy migration process and then realize that the migrated application VMs is not the right choice, and some other network topology changes may be in order for the migrated VM to work properly as desired.

Most of hybrid cloud solutions available in the market currently have no staging and/or simulation facility to help corporate IT administrators validate their cloud migration plan. For example, when deploying an application for the first time within an enterprise network, IT administrators generally have the luxury of being able to test and tweak without the burden of production traffic. In contrast, when an application is migrated to the cloud, IT administrators may have to test the application at the same time that users place product load on the application and other network resources.

A typical VM migration validation process in currently available hybrid cloud environments includes at least four operation phases: (1) configuration phase; (2) staging phase; (3) execution phase; and (4) validation phase. In the configuration phase, the cloud manager (e.g., 30) takes inputs from IT administrators for constructing a VM migration request (e.g., through suitably configured APIs to the management entity at the cloud). In the staging phase, the cloud manager may prepare the infrastructure for the VM migration request. For example, the cloud manager may instantiate appropriate cloud gateways, VM images, data transformation, and network configuration. In the execution phase, the cloud manager may transfer the VM images and data to cloud and launch the VM images and data using network resources. In the validation phase, IT administrators may work with (or alongside) application users to validate the functionality of the applications post VM migration.

Based on their best knowledge, IT administrators and application users may plan and execute a VM migration plan. The execution process may involve a repetitive preparation-migration-validation cycle. For example, certain network topology changes may be required to improve performance or to get an application working as desired at the cloud. The network topology change may result in a re-deployment of the application in the cloud and re-execution and re-validation. While the cycling validation loop may be necessary to cope with the complexity of application VM migration process, the long VM image/data transferring time in the loop may be simply not practical. Ideally, this long delay (e.g., in VM image migration) should be avoided whenever possible, or at least reduced to the minimum, for the VM migration process.

Communication system 10 is configured to address these issues (and others) in offering a system and a method for simulating virtual machine migration in a network environment. Embodiments of communication system 10 can allow users to simulate a VM migration within enterprise network 12, before deploying the VM (e.g., VM 26(1)) in cloud 14.

The simulation can effectively help users to prepare their cloud migration plan. Embodiments of communication system 10 may add a simulation phase in the VM migration process.

In various embodiments, a temporary simulated cloud environment (e.g., simulated cloud 40) may be built in enterprise network 12 to simulate the VM migration process. The simulation phase can allow application functionality to be validated, debugged, and adjusted without the long delay of VM image transferring. The simulation can be configured so that WAN latency and errors may be eliminated in VM image/data transfer, and applied in application data transfers, to simulate the actual network data path of the applications deployed at cloud. In some embodiments, as a part of the cloud simulation, the cloud network overlay infrastructure (e.g., cloud gateway 22, and NVCs 28(1)-28(M)) can also be deployed in simulated cloud 40, for example, to allow certain infrastructure functionality (e.g. secure tunneling, routing, etc.) and network services (e.g. virtual firewall, WAN optimization) to be verified and tested in the simulation phase.

Embodiments of communication system 10 may provide for simulating, in simulated cloud 40, network resources (e.g., cVEM 24, VMs 26(1)-26(N), NVC 28(1)-28(M)) of a portion of cloud 14 within enterprise network 12, simulate network behavior of secure tunnel 18 in secure tunnel 48 within enterprise network 12 and validate application performance in simulated cloud 40. As used herein, the term "validate" can include any testing, measuring, or analyzing activities, including determining throughput, frame loss, and forwarding rates with various traffic configurations; determining application and network behavior under error or abnormal frame conditions; measuring effectiveness of quality of service (QoS) policies on traffic management; testing impact of bandwidth limitations; measuring response times; and such other activities. The term "application performance" includes application functionality, network performance of application data over the network connections, application availability, speed of application computation and data transfer, and other such application behavior and characteristics.

Embodiments of communication system 10 can offer several advantages. For example, VM migration plans can be tested verified prior to actual deployment in cloud 14. Thus, cost savings, both in terms of time and money may be achieved in the planning and feasibility studying of a VM migration project. Another example advantage may be to identify a set of application VMs that may be suitable candidates for migration to cloud 14. Because the simulation process could be repetitive in nature, simulating within a local resource facility, such as enterprise network 12, could ease the identification and migration process. Yet another example advantage may be validation of security policy for application VMs before deploying the VMs into cloud 14. Still another advantage may include facilitating quality assessment and development teams in problem isolation, regression testing, and performance tuning processes within a local computing resources center such as enterprise network 12. Embodiments of communication system 10 may also be made an extension to Virtual Station Interface Discovery Protocol (VDP) (e.g., according to IEEE 802.1 Qbg standards) of server virtualization systems.

Turning to the infrastructure of communication system 10, the network topology can include any number of servers, VMs, routers, gateways, and other nodes inter-connected to form a large and complex network. A node may be any electronic device, client, server, peer, service, application, or other object capable of sending, receiving, or forwarding information over communications channels in a network.

Elements of FIG. 1 may be coupled to one another through one or more interfaces employing any suitable connection (wired or wireless), which provides a viable pathway for electronic communications. Additionally, any one or more of these elements may be combined or removed from the architecture based on particular configuration needs. Communication system 10 may include a configuration capable of TCP/IP communications for the electronic transmission or reception of data packets in a network. Communication system 10 may also operate in conjunction with a User Datagram Protocol/Internet Protocol (UDP/IP) or any other suitable protocol, where appropriate and based on particular needs. In addition, gateways, routers, switches, and any other suitable nodes (physical or virtual) may be used to facilitate electronic communication between various nodes in the network.

Note that the numerical and letter designations assigned to the elements of FIG. 1 do not connote any type of hierarchy; the designations are arbitrary and have been used for purposes of teaching only. Such designations should not be construed in any way to limit their capabilities, functionalities, or applications in the potential environments that may benefit from the features of communication system 10. It should be understood that the communication system 10 shown in FIG. 1 is simplified for ease of illustration. For example, enterprise network 12 and cloud 14 may comprise access switches, aggregation switches, core switches to aggregate and distribute ingress (upstream traffic), and egress (downstream traffic) traffic, etc. A plurality of switches (virtual and/or physical) may be provided at each access, aggregation, and core level to achieve redundancy within enterprise network 12. Further, enterprise network 12 and cloud 14 may include elements particular to the type of network services provided; for example, in data centers that provide mass storage, enterprise network 12 and cloud 14 may include Storage Area Networks (SANs).

The example network environment may be configured over a physical infrastructure that may include one or more networks and, further, may be configured in any form including, but not limited to, local area networks (LANs), wireless local area networks (WLANs), VLANs, metropolitan area networks (MANs), wide area networks (WANs), VPNs, Intranet, Extranet, any other appropriate architecture or system, or any combination thereof that facilitates communications in a network. In some embodiments, a communication link may represent any electronic link supporting a LAN environment such as, for example, cable, Ethernet, wireless technologies (e.g., IEEE 802.11x), ATM, fiber optics, etc. or any suitable combination thereof. In other embodiments, communication links may represent a remote connection through any appropriate medium (e.g., digital subscriber lines (DSL), telephone lines, T1 lines, T3 lines, wireless, satellite, fiber optics, cable, Ethernet, etc. or any combination thereof) and/or through any additional networks such as a wide area networks (e.g., the Internet).

In various embodiments, cloud gateway 20 may be a VM running in enterprise network 12. Cloud gateway 20 may be responsible for establishing secure tunnel 18 for interconnecting components within enterprise network 12 with cloud gateway 22. Cloud gateway 22 may be another VM running in cloud 14. Cloud gateway 22 may also be responsible for establishing secure tunnel 18 to connect cloud gateway 20 at enterprise with allocated network resources in cloud 14. Cloud gateway 22 and cVEM 24 may together form a L2 switch. Each of cloud gateways 20 and 22 may be implemented on servers, switches, or other network elements.

In various embodiments, secure tunnel 18 may be an L4 Secure Tunnel to connect network resources allocated at cloud 14 with enterprise network 12. Secure tunnel 18 may be configured to cope with corporate firewall and network address translation (NAT), for example, from the nature of the transport level protocols (e.g. UDP/TCP) and the transport layer ports opened for hypertext transfer protocol (HTTP)/hypertext transfer protocol secure (HTTPS) in the firewall. VMs 26(1)-26(P) may be hosted on physical servers (not shown) in cloud 14. VMs 26(1)-26(P) in cloud 14 may be managed by a distributed virtual switch comprising various virtual network interface cards associated with each VM. VMs 26(1)-26(P) may be hosted on the corresponding servers with a corresponding hypervisor, which manages the hardware allocation between the various VMs hosted on a single server.

cVEM 24 can be a software component embedded in a hypervisor or similar software infrastructure of a network element. cVEM 24 can effectively replace a virtual switch by performing several network functions, including: advanced networking and security; switching between directly attached VMs (e.g., VMs 26(1)-26(P)); and uplinking to the rest of the network (e.g., enterprise network 12). Traffic may be switched locally at the cVEM interface; for example, cVEM 24 may switch traffic among VMs 26(1)-26(P). In various embodiments, NVCs 28(1)-28(P) may be virtual appliances deployed in cloud 14 as VMs. For example, NVCs 28(1)-28(P) 44 may run as virtual machines on corresponding hypervisors. In another example embodiment, NVCs 28(1)-28(P) may be deployed as corresponding hypervisors on operating systems. NVCs 28(1)-28(P) may provide hosting environments for respective VMs 26(1)-26(P). NVCs 28(1)-28(P) may also serve as protective barriers to respective VMs 26(1)-26(P), monitoring interactions between respective VMs 26(1)-26(P) and other network elements, for example, restricting the interactions to those that are deemed safe.

In various embodiments, network resources (e.g., cloud gateway 22, cVEM 24, VMs 26(1)-26(P), NVCs 28(1)-28(P), and other network elements) in cloud 14 may be substantially simulated within simulated cloud 40 in enterprise network 12. Suitable servers, routers, switches and other network elements within enterprise network 12 may be provisioned to provide the simulated network resources. As a result, the infrastructure pertaining to simulated cloud 40 may be substantially (or materially) similar to at least a portion of the infrastructure provided in cloud 14 according to the respective SLA between cloud 14 and enterprise network 12.

Cloud manager 30 is an application (e.g., computer program) running in enterprise network 12, for example, as a virtual machine. Cloud manager 30 may include a suitable graphical user interface (GUI) that can permit a user (e.g., customer, network administrator, etc.) to configure and request network resources in cloud 14. In an example embodiment, GUI of cloud manager 30 may include an option (e.g., menu option, clickable box, a selection from a list, etc.) for simulator 36, which is another application that may be integrated with cloud manager 30. When integrated with cloud manger 30, simulator 36 may be a set of object modules, executable modules, and other appropriate software components. In another embodiment, simulator 36 may be implemented as stand-alone software accessible through the GUI of cloud manager 30. When implemented as stand-alone software, simulator 36 may include executable files, libraries, and other software components. In yet another embodiment, simulator 36 may be accessed separately from cloud manager 30, for example, through an independent GUI, or a command line interface (CLI). Simulator 36 may be implemented within enterprise network 12 in any suitable manner, based on particular needs.

Simulator 36 may interface with CMB 32 to provision network resources in simulated cloud 40. CMB 32 may be part of cloud manager 30, for example, implemented as an object or executable module within cloud manager 30. Simulated Internet 50 may be a suitable network simulator, for example, that simulates traffic flow, network connectivity, network events, bandwidth, and other network parameters of Internet 16. Commercial and off-the-shelf software may be used to implement simulated Internet 50 using network elements within enterprise network 12.

Figure 2:
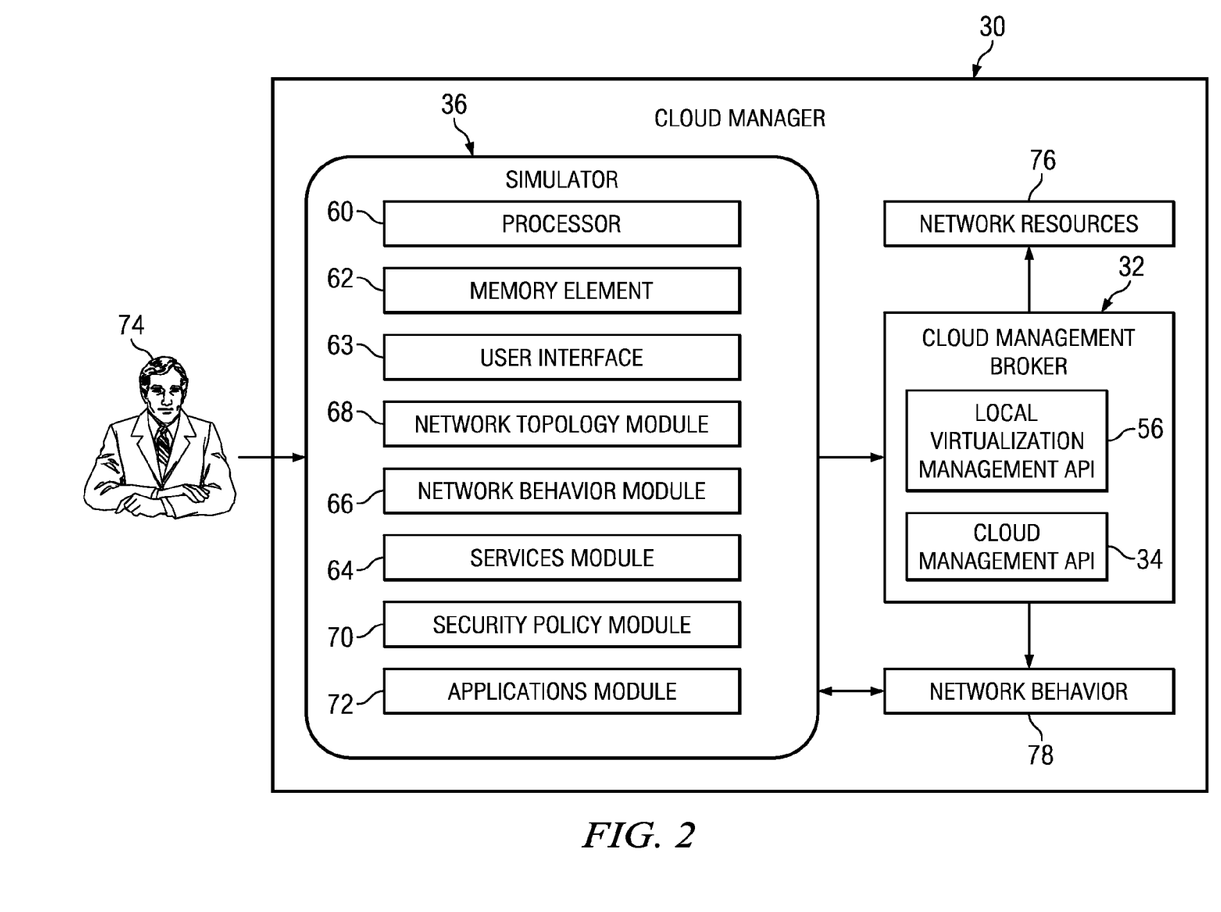
FIG. 2 is a simplified block diagram illustrating example details of the communication system in accordance with one embodiment.

Turning to FIG. 2, FIG. 2 is a simplified block diagram illustrating example details of an embodiment of communication system 10. Simulator 36 may be a component of cloud manager 30. In various embodiments, simulator 36 may use network resources provided by enterprise network 12 to simulate network resources in cloud 14. For example, in an example configuration including an enterprise datacenter and Amazon® cloud, simulator 36 uses computing resources provided by the enterprise datacenter to simulate the cloud resources provided by the Amazon cloud services. Once the VM migration process is validated, the application and business workload can move to Amazon cloud datacenter eventually.

Simulator 36 in enterprise network 12 may include a processor 60 and a memory element 62. In various embodiments, processor 60 and memory element 62 may be part of the infrastructure of enterprise network 12. In some embodiments, processor 60 and memory element 62 may be dedicated for use exclusively by simulator 36. In other embodiments, processor 60 and memory element 62 may be one or more processors and memory elements respectively, that are shared between various other components within enterprise network 12. In yet other embodiments, processor 60 may represent a virtual central processing unit (vCPU) and memory element 62 may represent virtual memory allocated to simulator 36 according to resource allocation specifications within enterprise network 12.

In various embodiments, simulator 36 may comprise a user interface 63, which may be a suitable GUI, or CLI, as appropriate. In addition, simulator 36 may comprise various modules, including a services module 64, a network behavior module 66, a network topology module 68, a security policy module 70, and an applications module 72. Simulator 36 may interface with CMB 32, which, in turn, can provision network resources 76 in simulated cloud 40 and manage network behavior 78 in secure tunnel 48 within enterprise network 12. CMB 32 may appropriately use local virtualization management API 56 to provision network resources 76 and manage network behavior 78.

During operation, a user 74 may request a simulation of network resources in cloud 14 using simulator 36. For example, prior to deploying a network service (e.g., wide area application services (WAAS)) in cloud 14, the user may simulate the effect of the deployment using simulator 36. In one example embodiment, user interface 63 may provide a drop-down menu informed by the appropriate SLA, regarding available network resources that may be provisioned in cloud 14. In one embodiment, services module 64 may provide a list of available services to user interface 63, and user 74 may select one of the listed services. Network behavior module 68 may present network behavior that may be suitably simulated in application data transfer and other network communication with simulated cloud 40. In one example, user 74 may manually input test network conditions; in another example, user 74 may input a desired application performance through user interface 63.

Simulator 36 may interface with CMB 32 to provision network resources 76 in simulated cloud 40 through suitable local virtualization management API 56. For example, the appropriate service (e.g., WAAS) requested by user 74 may be provisioned in simulated cloud 40. Network behavior module 68 (or CMB 32, in some embodiments) may monitor network behavior 78 of secure tunnel 48 within enterprise network 12. In another example embodiment, network behavior module 66 may inject WAN latency and error rate into secure tunnel 48. In a simulation mode (e.g., when user 74 selects to activate simulator 36), user 74 may configure a set of WAN latency and error rate parameters for conducting the simulation. The WAN latency and error rate can be applied to an outbound data path of cloud gateway 52 and cloud gateway 54, for example, to simulate inter-datacenter secure tunnels (e.g., 18) that may be connected across Internet 16. Simulator 36 may simulate services deployment, data transfer resulting from the services deployment and other activities from the service deployment in simulated cloud 40. Simulator 36 may present the results of the simulation to user 74 via user interface 63.

A VM migration in the simulation mode can validate if the VM migration has any impact to application functionality relevant to the migrated VMs (e.g., VM 44(1)-44(N)). If there is any undesired impact, suitable adjustments may be applied to the original migration plan and another validation cycle, via simulation, may be performed. The simulation may also facilitate measuring the performance of the application in the hybrid cloud environment, for example, so that application user expectation can be managed appropriately.

In another embodiment, the results from the simulation may indicate a change to network topology, either at cloud 14, or at enterprise network 12, to achieve the desired application performance. For example, due to application performance and/or security requirements, additional network service appliances (e.g. virtual firewall, WAN optimization, load-balancer, etc.) may be inserted onto the hybrid cloud network. Consequently, some adjustments (e.g., routing service insertion, WAN optimization service insertion, security service insertion, load-balancer service insertion) may be made to the original enterprise network topology. The hybrid cloud simulation mode can facilitate validating network service insertion and/or other adjustments to the hybrid cloud networks. With simulator 36, any undesired application performance impacts and network behavior resulting from the network topology changes can be further isolated and resolved even before the application workload is actually deployed in cloud 14. In one example embodiment, network topology module 68 may suggest changes to network topology, for example, to obtain a desired application performance. In another example embodiment, user 74 may select from alternatives, or create new topology elements with network topology module 68, via suitable user interface 63.

In another embodiment, enterprise network 12 may include a virtual security gateway (VSG) that can enforce security policies on network traffic flowing between VMs in enterprise network 12 and cloud 14 (or simulated cloud 40). With the VSG deployed at enterprise network 12, there may be a foreseeable latency in policy evaluation due to the network path traveling through Internet 16. The latency can impact security enforcement mechanisms (e.g., flow cache in cVEM 24) and cause many potential problems. One possible solution to the problem may be to deploy VSG in cloud 14 as well. Simulator 36 may be used to evaluate the effect of VSG deployment in cloud 14. For example, security policy module 70 may help to validate new cloud security policy with VSG deployed in simulated cloud 40. With simulator 36, any security policy inconsistency and undesirable network enforcing behaviors resulting by security policy changes can be further isolated and resolved even before the security policy is deployed into cloud 14.

Figure 3:
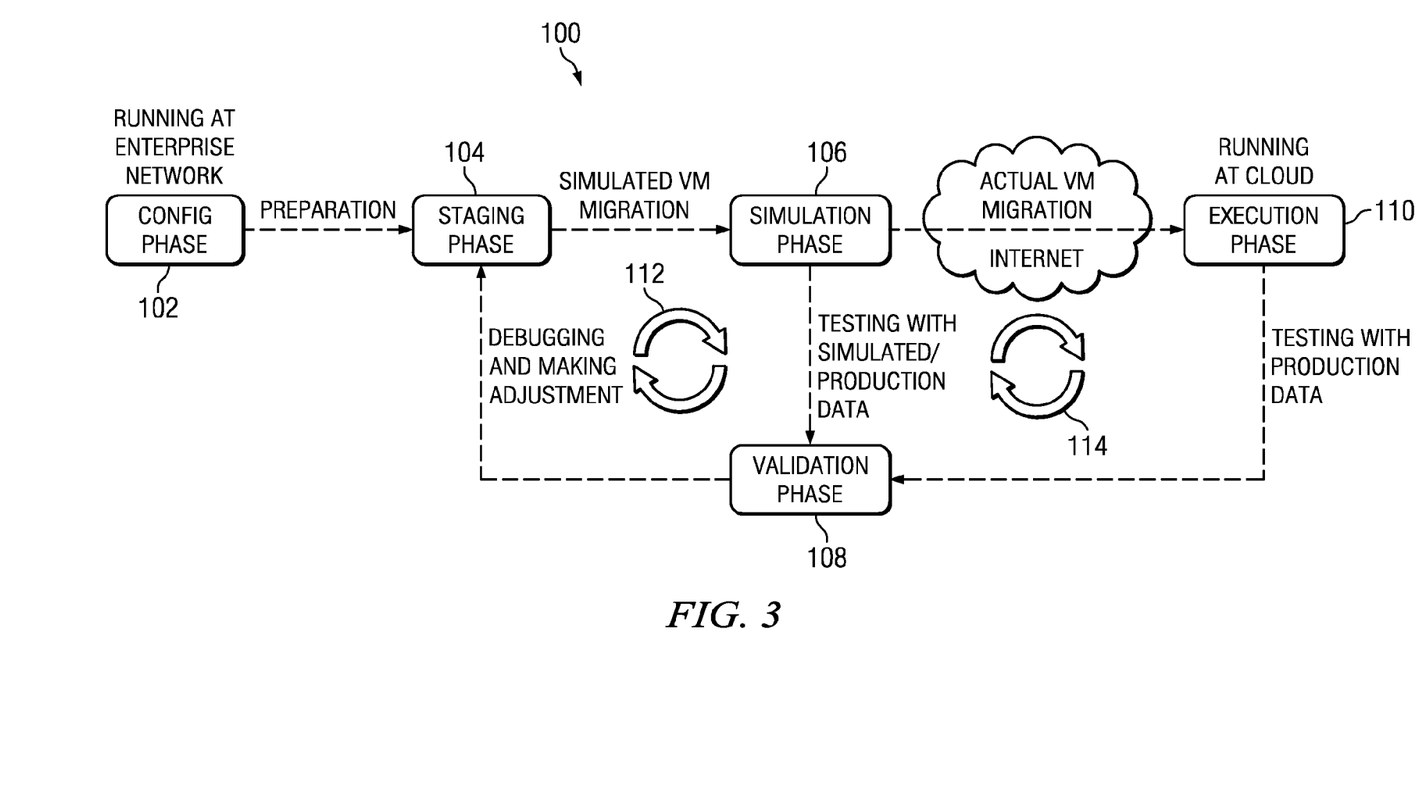
FIG. 3 is a simplified block diagram illustrating example activities that may be associated with an embodiment of communication system.

Turning to FIG. 3, FIG. 3 is a simplified flow diagram illustrating a simulation and deployment process according to an embodiment of communication system 10. Process 100 includes a configuration phase 102, followed by a staging phase 104. At configuration phase 102, cloud manager 30 may take inputs from administrators (e.g., user 74) for constructing a VM migration request. At staging phase 104, cloud manager 30 may prepare the network infrastructure for the VM migration request. For example, cloud manager 30 may instantiate cloud gateways (e.g., 20, 52) and VM images (e.g., 26(1)-26(N); 44(1)-44(N)), transform appropriate data for the VM migration and configure enterprise network 12 suitably. At simulation phase 106, simulator 36 may be activated and simulated cloud 40 instantiated within enterprise network 12. At validation phase 108, administrators may work with application users, or various options in simulator 36, to validate functionalities of the applications post VM migration. For example, the deployment may be tested with simulated or production data. At execution phase 110, cloud manager 30 may transfer VM images and data to cloud 14 and launch the VM images and data using network resources in cloud 14.

According to embodiments of communication system 10, two repetitive preparation-migration-validation loops 112 and 114 may be implemented. Loop 112 may involve migration phases and simulation, whereas loop 114 may replace simulation phase 106 with the actual VM migration in execution phase 110. A difference between the processing models of loops 112 and 114 is the avoiding of long delay in transferring VM image/data across Internet 16. For example, in loop 112, VM images may be deployed in simulated cloud 40 without actually transferring them over secure tunnel 48. Consequently, WAN latency, errors, etc. may not be relevant at the VM image deployment simulation. However, the WAN latency and errors may be applied at simulation phase 106. Network administrators may try out the planned VM through one or more validation, debugging, and adjustment cycles. Once bugs and/or inappropriate configuration issues are ironed out, the network administrators can proceed with the actual deployment in cloud 14 directly from simulation phase 106 (e.g., without repeating configuration phase 102 and staging phase 104). During implementation of loop 114, minor issues may be encountered, and they can be resolved appropriately, for example, through validation phase 108. Validation phase 108 may be repeated by testing with production data. If a simulation is required, loop 112 may be appropriately repeated as desired.

Figure 4:
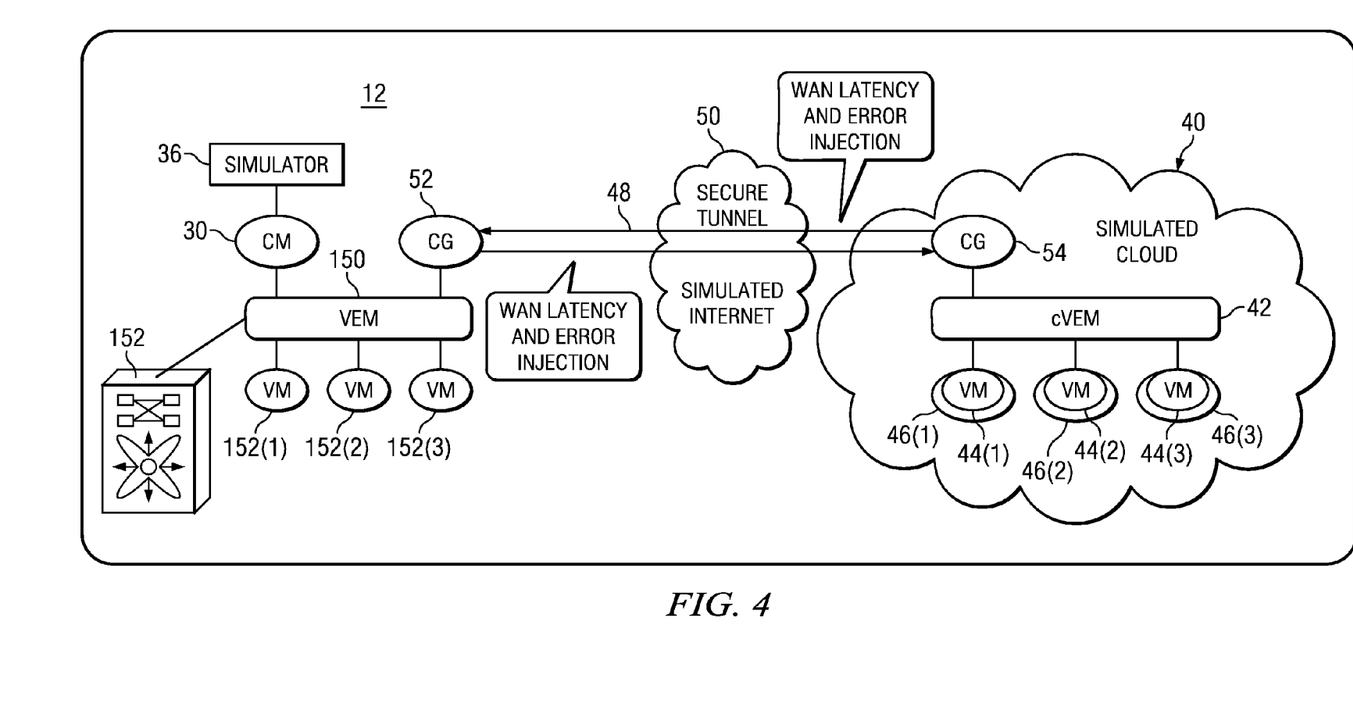
FIG. 4 is a simplified block diagram illustrating example details of the communication system in accordance with another embodiment of the communication system.

Turning to FIG. 4, FIG. 4 is a simplified block diagram illustrating an example simulation of Internet 16. A VEM 150 in enterprise network 12 may be part of DVS 152. Cloud manager 30 may manage allocation of network resources via VEM 150. VEM 150 may connect various VMs 152(1)-152(3) to simulated cloud 40 via cloud gateway 52, over simulated Internet 48. Simulator 36 can inject WAN latency and errors into secure tunnel 48 between cloud gateway 52 and cloud gateway 54 in simulated cloud 40 to determine any adverse effects on performance of business applications running in VMs 44(1)-44(N).

In various embodiments, simulator 36 may interface with off-the-shelf simulator/emulator tools that can perform the WAN latency and error injection. In other embodiments, simulator 36 may execute its own internal instructions to perform WAN latency and error injection. Any suitable method may be used to implement WAN latency and error injection in secure tunnel 48. Simulator 36 may measure network performance (e.g., dropped packets, QoS, congestion, etc.) and application behavior (e.g., computation speed, functionality, etc.) and report the results on user interface 63. In various embodiments, the results may be stored into a log, report, database, files, etc. for future reporting and other needs. By simulating both cloud 14 (in simulated cloud 40) and secure tunnel 18 (in secure tunnel 48), embodiments of communication system 10 can achieve accuracy in monitoring application performance for various network behavior.

Figure 5:
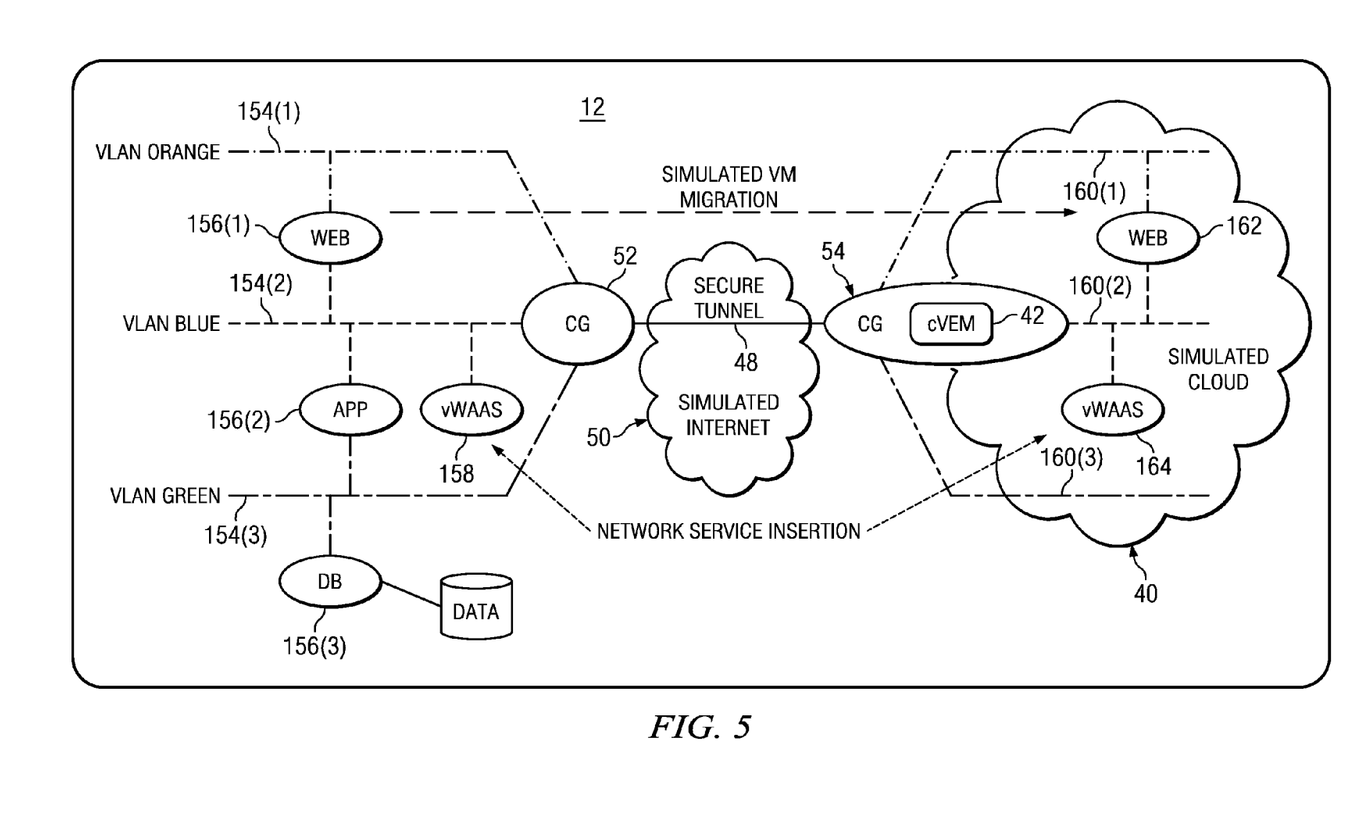
FIG. 5 is a simplified block diagram illustrating example details of the communication system in accordance with yet another embodiment of the communication system.

Turning to FIG. 5, FIG. 5 is a simplified block diagram illustrating a network service insertion according to an example embodiment of communication system 10. Enterprise network 12 may include various virtual local area networks (VLANS), representatively shown here as 154(1)-154(3). Enterprise network 12 may also include various distributed applications. For example, a distributed application may comprise a web application 156(1) on VLAN 154(1) (e.g., web layer VLAN, "VLAN Orange"), an application 156(2) on VLAN 154(2) (e.g., applications layer VLAN, "VLAN Blue") and a database application 156(3) on VLAN 154(3) (e.g., database layer VLAN, "VLAN Green"). Enterprise network 12 may also include other applications such as service appliances, including a virtual Wide Area Application Services (vWAAS) 158. Each application may be hosted on a separate virtual machine (e.g., VM 152(1)-152(3)) within enterprise network 12.

According to embodiments of communication system 10, the VLAN architecture of enterprise network 12 may be extended into simulated cloud 40. For example, simulated cloud 40 may include VLANs 160(1)-160(3). VLAN 160(1) may be an extension of VLAN 154(1); VLAN 160(2) may be an extension of VLAN 154(2); and VLAN 160(3) may be an extension of VLAN 154(3). Although three VLANs are illustrated in the FIGURE, any number of VLANs may be provisioned in enterprise network 12, and/or simulated cloud 40 within the broad scope of the present disclosure. Parts of the distributed application in enterprise network 12 may be extended into simulated cloud 40. For example, web application 156(1) may be migrated to simulated cloud 40 as a web application 162. Network service appliances may also be migrated (or inserted as needed) into simulated cloud 40. For example, vWAAS 158 may be moved, replicated, or extended into simulated cloud 40 as a vWAAS 164.

Figure 6:
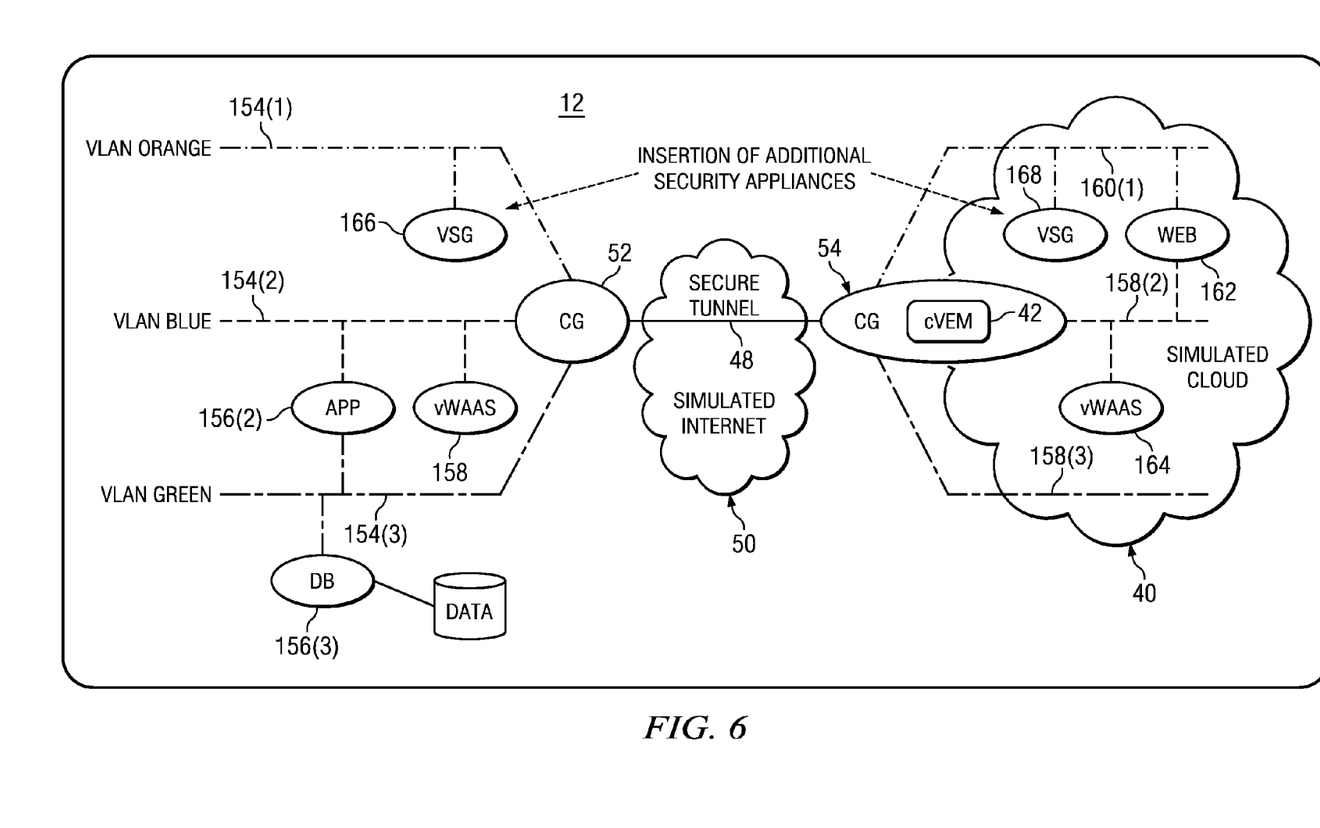
FIG. 6 is a simplified block diagram illustrating example details of the communication system in accordance with yet another embodiment of the communication system.

Turning to FIG. 6, FIG. 6 is a simplified block diagram illustrating a network security insertion according to an example embodiment of communication system 10. Enterprise network 12 may include a VSG 166. Using security policy module 64, simulator 36 may effect a migration, or insertion, of additional security appliances such as VSG 168 in simulated cloud 40. VSG 168 in simulated cloud 40 may be activated to simulate security policy enforcements at VMs 44(1)-44(N) in simulated cloud 40. Results from the simulation may be used for various purposes, for example, to ensure that security policies are enforced appropriately, and inefficiencies are eliminated.

Figure 7:
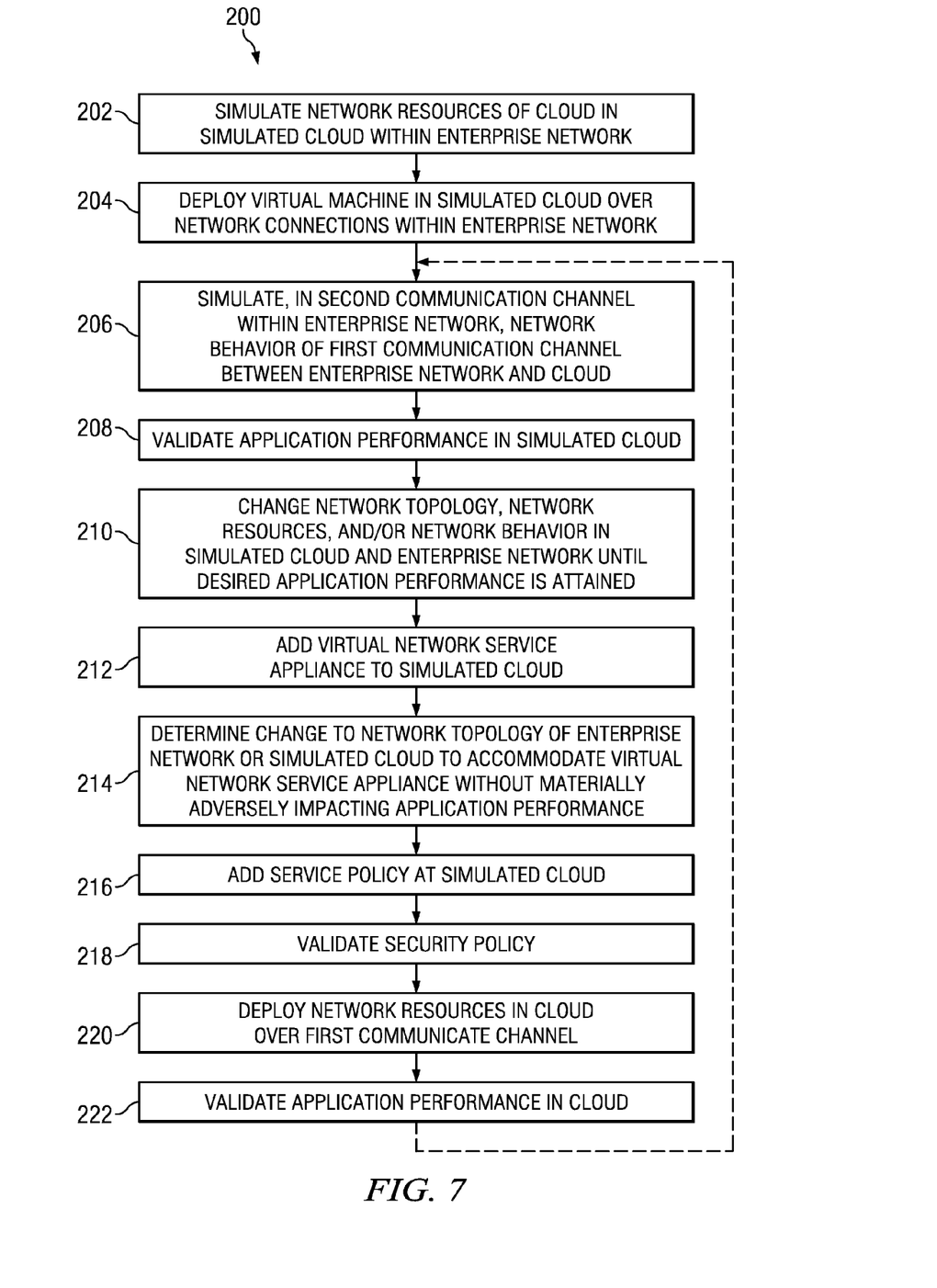
FIG. 7 is a simplified flow diagram illustrating example activities that may be associated with an embodiment of the communication system.

Turning to FIG. 7, FIG. 7 is a simplified flow diagram illustrating example activities that may be associated with embodiments of communication system 10. Operations 200 may include 202, where simulator 36 may instruct CMB 32 to simulate network resources of cloud 14 in simulated cloud 40 within enterprise network 12. CMB 32 may provision appropriate network resources using local virtualization management API 56. At 204, VMs 44(1)-44(N) may be deployed over network connections within enterprise network 12. Deployment of VMs 44(1)-44(N) may not involve significant time delay in many embodiments, as local network connections, such as Ethernet, can be used for the deployments. In addition, a real deployment of VMs 26(1)-26(N) in cloud 14 can involve significant time delay (e.g., a 10 GB Windows Server 2008 SP2 VMDK image takes approximately 2 hours to import when it is transferred over a 10 Mbps network connection).

At 206, simulator 26 may simulate in a second communication channel (e.g., secure tunnel 48) within enterprise network 12, network behavior of the first communication channel (e.g., secure tunnel 18) between enterprise network 12 and cloud 14. At 208, simulator 36 may validate application performance in simulated cloud 40. At 210, simulator 36 may change network topology, network resources, and/or network behavior in simulated cloud 40 and enterprise network 12 until desired application performance is attained. In some embodiments, simulator 36 may allow user 74 to modify network topology, network resources, and/or network behavior over user interface 63. In other embodiments, simulator 36 may be configured to automatically and iteratively change network topology, network resources, and/or network behavior until the desired application performance is attained.

At 212, simulator 36 may add a network service appliance (e.g., vWAAS 164) to simulated cloud 40. In some embodiments, simulator 36 may allow user 74 to provide instructions on which network service appliance to add, and where (e.g., "add vWAAS 164 in VLAN 158(2)"). In other embodiments, simulator 36 may determine the service appliance to add, and the appropriate location to add the service appliance based on various network policies, application performance, network behavior, and other factors. At 214, simulator 36 may determine a change to network topology of enterprise network 12 or simulated cloud 40 to accommodate virtual network service appliance without materially adversely impacting application performance. In some embodiments, the change determination may be pursuant to predetermined logic in simulator 36. In other embodiments, the change determination may be ad-hoc, or based on heuristics. In yet other embodiments, the change determination may be user provided.

At 216, simulator 36 may add service policy at simulated cloud 40. For example, the service policy may specify actions to be performed on detecting certain traffic; enforcement mechanisms to be activated at specific VMs in simulated cloud 40; etc. Simulator 36 may test the service policy effectiveness and associated application performance in various simulations. The activities performed by simulator 36 may be prompted by user instructions on user interface 63, or according to pre-determined logic, heuristics, and other suitable methods. At 218, simulator 36 may validate the security policy. Validating may include isolating a security policy inconsistency and isolating a particular undesirable network enforcement activity by simulated cloud 40. For example, simulator 36 may test application performance, and determine that the security policy does not adversely impact network speed over secure tunnel 48. In another example, simulator 36 may test if desired enforcement actions are being triggered according to the policy. If changes may be needed, simulator 36 may suitably effect such changes based on particular needs.

At 220, network resources may be deployed in cloud 14 over the first communication channel (e.g., secure tunnel 18), for example, after simulations indicate an optimal network topology, and network resources for the predicted network behavior over the first communication channel (e.g., secure tunnel 18). At 222, application performance in cloud 14 may be validated, for example, with production data. If further changes are in order, steps 206-222 may be repeated until the desired application performance is attained.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Note also that an "application" as used herein this Specification, can be inclusive of an executable file comprising instructions that can be understood and processed on a computer, and may further include library modules loaded during execution, object files, system files, hardware logic, software logic, or any other executable modules.

In example implementations, at least some portions of the activities outlined herein may be implemented in software in, for example, simulator 36, and cloud manager 30. In some embodiments, one or more of these features may be implemented in hardware, provided external to these elements, or consolidated in any appropriate manner to achieve the intended functionality. The various network elements (e.g., cloud manager 30, simulated cloud 40, secure tunnel 48) may include software (or reciprocating software) that can coordinate in order to achieve the operations as outlined herein. In still other embodiments, these elements may include any suitable algorithms, hardware, software, components, modules, interfaces, or objects that facilitate the operations thereof.

Furthermore, cloud manager 30, simulated cloud 40, secure tunnel 48 described and shown herein (and/or their associated structures) may also include suitable interfaces for receiving, transmitting, and/or otherwise communicating data or information in a network environment. Additionally, some of the processors and memory elements associated with the various nodes may be removed, or otherwise consolidated such that a single processor and a single memory element are responsible for certain activities. In a general sense, the arrangements depicted in the FIGURES may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In some of example embodiments, one or more memory elements (e.g., memory element 62) can store data used for the operations described herein. This includes the memory element being able to store instructions (e.g., software, logic, code, etc.) in non-transitory media such that the instructions are executed to carry out the activities described in this Specification. A processor can execute any type of instructions associated with the data to achieve the operations detailed herein in this Specification. In one example, processors (e.g., 60) could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, components in communication system 10 can include one or more memory elements (e.g., memory element 62) for storing information to be used in achieving operations as outlined herein. These devices may further keep information in any suitable type of non-transitory storage medium (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. The information being tracked, sent, received, or stored in communication system 10 could be provided in any database, register, table, cache, queue, control list, or storage structure, based on particular needs and implementations, all of which could be referenced in any suitable timeframe. Any of the memory items discussed herein should be construed as being encompassed within the broad term 'memory element.' Similarly, any of the potential processing elements, modules, and machines described in this Specification should be construed as being encompassed within the broad term 'processor.'

It is also important to note that the operations and steps described with reference to the preceding FIGURES illustrate only some of the possible scenarios that may be executed by, or within, the system. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure. For example, although the present disclosure has been described with reference to particular communication exchanges involving certain network access and protocols, communication system 10 may be applicable to other exchanges or routing protocols. Moreover, although communication system 10 has been illustrated with reference to particular elements and operations that facilitate the communication process, these elements, and operations may be replaced by any suitable architecture or process that achieves the intended functionality of communication system 10.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method, comprising:
    simulating, by a simulator using a processor and a memory element in a network, network resources of a portion of a particular cloud that communicates with an enterprise network over a first communication channel, wherein the simulating occurs within a simulated cloud within the enterprise network, wherein the network resources include network elements, links and data, wherein the simulating includes allocating network resources to the simulated cloud from a local resource pool within the enterprise network;
    simulating, by the simulator using the processor and the memory element, network behavior of the first communication channel in a second, simulated communication channel within the enterprise network, wherein the first communication channel connects a first cloud gateway within the enterprise network to a second cloud gateway within the cloud, wherein the second simulated communication channel connects a third cloud gateway within the enterprise network to a fourth cloud gateway within the simulated cloud in the enterprise network; and
    validating application performance in the simulated cloud.

2. The method of claim 1, wherein the first communication channel has a first wide area network (WAN) latency and a first error rate, and wherein the simulating of the network behavior includes adding a second WAN latency and injecting a second error rate in the second communication channel, wherein the second WAN latency and the second error rate substantially replicate the first WAN latency and the first error rate, respectively.

3. The method of claim 1, wherein the third cloud gateway simulates the first cloud gateway, and the fourth cloud gateway simulates the second cloud gateway.

4. The method of claim 1, wherein the first communication channel is provided over a public network, and wherein the second communication channel is provided over a simulated public network within the enterprise network, and wherein the simulated public network is similar to the public network.

5. The method of claim 1, wherein the simulating network resources comprises:
    providing a cloud resources abstraction layer in the enterprise network; and
    allocating enterprise network resources in the enterprise network to the simulated cloud, wherein the allocating occurs via the cloud resources abstraction layer.

6. The method of claim 1, further comprising:
    deploying a virtual machine in the simulated cloud over network connections within the enterprise network.

7. The method of claim 1, further comprising:
    adding a virtual network service appliance to the simulated cloud; and
    determining a change to a network topology of the enterprise network to accommodate the virtual network service appliance.

8. The method of claim 1, further comprising:
    adding a security policy at the simulated cloud; and
    validating the security policy, wherein the validating comprises isolating a security policy inconsistency and isolating a particular network enforcement activity by the simulated cloud.

9. Logic encoded in non-transitory media that includes instructions for execution and when executed by a processor, is operable to perform operations comprising:

simulating, by a simulator using the processor and a memory element in a network, network resources of a portion of a particular cloud that communicates with an enterprise network over a first communication channel, wherein the simulating occurs within a simulated cloud within the enterprise network, wherein the network resources include network elements, links and data, wherein the simulating includes allocating network resources to the simulated cloud from a local resource pool within the enterprise network;

simulating, by the simulator using the processor and the memory element, network behavior of the first communication channel in a second, simulated communication channel within the enterprise network, wherein the first communication channel connects a first cloud gateway within the enterprise network to a second cloud gateway within the cloud, wherein the second simulated communication channel connects a third cloud gateway within the enterprise network to a fourth cloud gateway within the simulated cloud in the enterprise network; and validating application performance in the simulated cloud.

10. The logic of claim 9, wherein the first communication channel has a first WAN latency and a first error rate, and wherein the simulating network behavior includes adding a second WAN latency and injecting a second error rate in the second communication channel, wherein the second WAN latency and the second error rate substantially replicate the first WAN latency and the first error rate, respectively.

11. The logic of claim 9, wherein the third cloud gateway simulates the first cloud gateway, and the fourth cloud gateway simulates the second cloud gateway.

12. The logic of claim 9, wherein the simulating network resources comprises:
providing a cloud resources abstraction layer in the enterprise network; and
allocating enterprise network resources in the enterprise network to the simulated cloud, wherein the allocating occurs via the cloud resources abstraction layer.

13. The logic of claim 9, wherein the first communication channel is provided over a public network, and wherein the second communication channel is provided over a simulated public network within the enterprise network, and wherein the simulated public network is similar to the public network.

14. The logic of claim 9, the operations further comprising:
deploying a virtual machine in the simulated cloud over network connections within the enterprise network.

15. An apparatus, comprising:
a memory element for storing data; and
a processor that executes instructions associated with the data, wherein the processor and the memory element cooperate such that the apparatus is configured for:

simulating network resources of a portion of a particular cloud that communicates with an enterprise network over a first communication channel, wherein the simulating occurs within a simulated cloud within the enterprise network, wherein the network resources include network elements, links and data, wherein the simulating includes allocating network resources to the simulated cloud from a local resource pool within the enterprise network;

simulating network behavior of the first communication channel in a second, simulated communication channel within the enterprise network, wherein the first communication channel connects a first cloud gateway within the enterprise network to a second cloud gateway within the cloud, wherein the second simulated communication channel connects a third cloud gateway within the enterprise network to a fourth cloud gateway within the simulated cloud in the enterprise network; and validating application performance in the simulated cloud.

16. The apparatus of claim 15, wherein the first communication channel has a first WAN latency and a first error rate, and wherein the simulating network behavior includes adding a second WAN latency and injecting a second error rate in the second communication channel, wherein the second WAN latency and the second error rate substantially replicate the first WAN latency and the first error rate, respectively.

17. The apparatus of claim 15, wherein the third cloud gateway simulates the first cloud gateway, and the fourth cloud gateway simulates the second cloud gateway.

18. The apparatus of claim 15, wherein the simulating network resources comprises:
providing a cloud resources abstraction layer in the enterprise network; and
allocating enterprise network resources in the enterprise network to the simulated cloud, wherein the allocating occurs via the cloud resources abstraction layer.

19. The apparatus of claim 15, wherein the first communication channel is provided over a public network, and wherein the second communication channel is provided over a simulated public network within the enterprise network, and wherein the simulated public network is similar to the public network.

20. The apparatus of claim 15, the apparatus further configured for:
deploying a virtual machine in the simulated cloud over network connections within the enterprise network.

* * * * *